US010823157B2

(12) United States Patent
John et al.

(10) Patent No.: US 10,823,157 B2
(45) Date of Patent: Nov. 3, 2020

(54) FREQUENCY CONTROL FOR A FREQUENCY GENERATOR OF AN ION ENGINE

(71) Applicant: TESAT-SPACECOM GMBH & CO. KG, Backnang (DE)

(72) Inventors: Frederik John, Bruchsal (DE); Alexander Lampe, Aspach (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 291 days.

(21) Appl. No.: 15/898,892

(22) Filed: Feb. 19, 2018

(65) Prior Publication Data
US 2018/0283365 A1   Oct. 4, 2018

(30) Foreign Application Priority Data
Apr. 4, 2017   (DE) .................. 10 2017 107 177

(51) Int. Cl.
*H03L 7/00* (2006.01)
*F03H 1/00* (2006.01)
(Continued)

(52) U.S. Cl.
CPC .......... *F03H 1/0006* (2013.01); *B64G 1/405* (2013.01); *F03H 1/0018* (2013.01);
(Continued)

(58) Field of Classification Search
CPC .......... B64G 1/405; B64G 1/42; B64G 1/428; F03H 1/0018; F03H 1/0015;
(Continued)

(56) References Cited

U.S. PATENT DOCUMENTS 4,891,600 A * 1/1990 Cox .................. F03H 99/00
                                                    250/251
5,790,568 A * 8/1998 Luong .............. H03M 13/15
                                                    714/781
(Continued)

OTHER PUBLICATIONS

European Patent Office, European Search Report for European Patent Application No. EP18155803 dated Jun. 8, 2018.

*Primary Examiner* — Haissa Philogene
(74) *Attorney, Agent, or Firm* — Jenkins, Wilson, Taylor & Hunt, P.A.

(57) ABSTRACT

A control device includes an acquiring unit and a processing unit. The acquiring unit acquires a voltage course and a current course of a determinable number of periods of a frequency generator and transmits these to the processing unit. The processing unit determines a temporal offset $\Delta t_1$ between a rising edge of the current course and a rising edge of the voltage course for each period of the determinable number of periods, and further determines if this temporal offset $\Delta t_1$ is positive or negative. The processing unit determines a difference between the number of periods with positive temporal offset and the number of periods with negative temporal offset within the determinable number of periods, and generates and adapts a switching signal for a switch-on time of the voltage course if the number of periods with positive temporal offset differs from the number of periods with negative temporal offset.

15 Claims, 2 Drawing Sheets

(51) Int. Cl.
    *H03L 5/02*         (2006.01)
    *H05H 1/46*         (2006.01)
    *H03J 3/04*         (2006.01)
    *H03L 7/085*        (2006.01)
    *B64G 1/40*         (2006.01)
    *H05H 1/54*         (2006.01)

(52) U.S. Cl.
    CPC .............. *F03H 1/0037* (2013.01); *H03J 3/04* (2013.01); *H03L 5/02* (2013.01); *H03L 7/00* (2013.01); *H03L 7/085* (2013.01); *H05H 1/46* (2013.01); *H05H 1/54* (2013.01); *H05H 2001/4682* (2013.01)

(58) Field of Classification Search
    CPC .... F03H 1/0037; F03H 1/0043; F03H 1/0006; H03L 7/00; H03L 7/04; H03L 7/085; H03L 7/087; H03L 5/02; H05H 1/46; H05H 1/54; H05H 5/047; H05H 2001/4682; H03J 3/04; H03K 17/28; H04B 7/18513; G01R 19/12; G01R 19/14
    See application file for complete search history.

(56) References Cited

U.S. PATENT DOCUMENTS

| | | | | |
|---|---|---|---|---|
| 6,958,063 | B1* | 10/2005 | Soll | A61B 18/042 |
| | | | | 606/32 |
| 8,378,695 | B2* | 2/2013 | Feldtkeller | H02M 1/38 |
| | | | | 324/207.19 |
| 9,276,495 | B2* | 3/2016 | Portisch | H02M 1/44 |
| 2009/0058303 | A1 | 3/2009 | Kadrnoschka et al. | |
| 2011/0277444 | A1 | 11/2011 | Leiter et al. | |

\* cited by examiner

FREQUENCY CONTROL FOR A FREQUENCY GENERATOR OF AN ION ENGINE

CROSS-REFERENCE TO PRIORITY APPLICATION

This application claims the benefit of, and priority to, German patent application number 102017107177.6, filed Apr. 4, 2017. The content of the referenced application is incorporated by reference herein.

TECHNICAL FIELD

The description relates to a control device for a frequency generator, an ion engine for a satellite with such a control device, a satellite with an ion engine, and a method for generating a switching signal for a frequency generator.

BACKGROUND

Ion engines are typically used as propulsion or drive for spacecraft. An ion beam is generated and drives the spacecraft according to the reaction principle or jet force principle. The ion beam is generated by ionizing particles and then accelerating them in an electric field.

In the so-called radio-frequency ion engine, the ions are generated by means of inductive coupling of a high-frequency signal. In order to generate this high-frequency signal, usually a resonant circuit or frequency generator is used.

BRIEF SUMMARY

There may be a need to improve the tracking of the frequency of a frequency generator, in particular to compensate for changes in the resonant frequency of a resonant circuit. This task arises in particular in connection with ion engines, since the ignition of the plasma often leads to a change in the resonant frequency and there is a risk that the plasma extinguishes or does even not ignite if the resonant circuit is not operated at its resonant frequency. The resulting losses may cause the plasma to extinguish.

According to a first aspect, a control device for a frequency generator is provided. The control device comprises an acquiring unit and a processing unit. The acquiring unit is configured to acquire a voltage course and a current course of a determinable number of periods of the frequency generator and to transmit these to the processing unit. The processing unit is configured to determine a temporal offset between a rising edge of the current course and a rising edge of the voltage course for each period of the determinable number of periods, and further to determine if this temporal offset is positive or negative. The processing unit is furthermore configured to determine a difference between the number of periods with positive temporal offset and the number of periods with negative temporal offset within the determinable number of periods, and to generate and adapt a switching signal for a switch-on time of the voltage course if the number of periods with positive temporal offset differs from the number of periods with negative temporal offset.

In other words, a plurality or a predeterminable number of periods of the frequency generator is acquired and it is determined for each individual period how voltage and current are offset with respect to each other over the said plurality of periods. The information determined in this way is used as the basis for the regulation or control of the frequency. This is done by determining for each individual period over the plurality of periods whether the voltage or the current increases first. The extent of the time lag or temporal offset between voltage and current, however, is of secondary or minor importance. Depending on the measurement accuracy, there is a time lag between voltage and current for almost every period, even if a resonant circuit is practically operated at its resonant frequency. Statistically, the smallest fluctuations result in that at half of the periods the voltage increases first and at the other half the current increases first. If the resonant circuit is operated in resonance, however, this is a consequence of natural fluctuations and tolerances and does not indicate a maladjustment or misadjustment.

Based on these considerations, it has been recognized that the resonant frequency of a resonant circuit may be adjusted depending on whether there is an imbalance or disparity in the time lag or temporal offset in favor of either voltage or current. This imbalance may be determined by determining and recording the time lag (time offset or temporal offset) between voltage and current and the frequency (or number) of the respective occurrence over the plurality of periods considered.

A frequency generator may be, for example, a resonant circuit, wherein the resonant circuit has a capacitive component, an inductive component, and an ohmic component. The resonant circuit has a so-called resonant frequency at which the proportion or share of the reactive power is as low as possible or approaches zero.

The time offset between the rising edges can be calculated by subtracting the zero crossing time of the voltage waveform (voltage course or voltage curve) from the zero crossing time of the current waveform (current course or current curve). It follows that the time offset is a negative value, if the voltage waveform is delayed in time with respect to the current waveform, because the time of the zero crossing of the voltage waveform is greater (later) than the time of the zero crossing of the current waveform. The zero crossing of the voltage waveform or the current waveform indicates an edge and in particular indicates a rising edge when the zero crossing results in a change from a negative voltage or a negative current to a positive voltage or a positive current, respectively.

If the frequency generator or the resonant circuit is operated at its resonant frequency, then there is none or almost no temporal offset between the rising edges of the current waveform and the voltage waveform. As stated above, however, a minimum time offset can still be determined if the measurement accuracy is increased as desired. External parameters or environmental influences, such as the temperature of the environment or radiation influences or also a varying load of the resonant circuit by any load with ohmic, inductive and/or capacitive shares may affect the frequency generator such that the resonant frequency shifts. However, this may be an undesired behavior and may in particular cause the reactive power to increase. When using the frequency generator in an ion engine, the change in the resonant frequency and the possibly associated increase in power loss (or dissipation loss) or increase in reactive power may cause the plasma to extinguish or not ignite at all. The control device described herein makes it possible to generate and output switching signals for switch-on times (turn-on instants) of the voltage waveform in order to operate the frequency generator in resonance with high accuracy.

As soon as the frequency generator is no longer operated at the resonance frequency, this results in the number of periods with a negative temporal offset differs from the number of periods with a positive temporal offset. This difference is used as a basis for changing the switch-on time of the voltage waveform. If, on the other hand, the frequency generator is operated at the resonant frequency, the negative temporal offset and the positive temporal offset occur with approximately same or equal frequency (as a result of the statistical distribution, see explanations above). In that case, it is not necessary to change the switch-on time of the voltage waveform.

In particular, it is not necessary for the control device described herein to detect or acquire the absolute value of the temporal offset and to use this absolute value of the temporal offset for adjusting the switch-on time of the voltage waveform. Rather, reference is made to a predetermined or predefinable number of periods of the frequency generator and is merely determined for each individual period whether there is a positive or a negative temporal offset between the rising edge of the current waveform and the rising edge of the voltage waveform. For example, a few tens to hundreds or even up to several hundred periods may be considered. For example, 32 periods of the past may be taken into account. In principle, with increasing number of considered periods, the effects or impacts of a few periods on changing the switch-on time of the voltage waveform are lower.

It is also possible that, depending on the difference between the number of periods with positive and negative temporal offset, the switch-on time of the voltage waveform is changed more or less strongly. In the above example of 32 periods considered, 16 periods may have a positive temporal offset and another 16 periods may have a negative temporal offset. In this case, the switch-on time of the voltage waveform is not changed. If, however, of the 32 periods considered, 28 periods have a negative temporal offset and only four periods have a positive temporal offset, this is an indication that the switch-on time of the voltage waveform must be changed. At the ratio of 28 to four (28 periods with negative temporal offset and four periods with positive temporal offset), the change in switch-on time is typically qualitatively greater than at a ratio of 18 to 14.

In one embodiment, the processing unit determines the temporal offset (i.e., whether the temporal offset is positive or negative) between the rising edges of the current waveform and the voltage waveform by means of digitally operating components. This may have the effect that a temporal offset is determined in any case, no matter how small. It is this approach that contributes to the fact that not the absolute temporal offset is used, but the ratio of the number of positive and negative temporal offset in a given period of time or within a predetermined number of periods of the frequency generator.

The switching signal specifies the switch-on time of the voltage waveform or the switching operations for the rising edge of the voltage are initiated by the switching signal. For example, the processing unit may comprise a switching signal generator, which is coupled with a switch circuit at least indirectly. For example, it can be deduced from the switching signal when a switch circuit is to be switched.

If the current precedes the voltage, a resonant circuit is typically referred to as capacitive behavior and it is defined that the phase shift is less than zero. In the opposite case it applies that it is referred to as inductive behavior and it is defined that the phase shift is greater than zero.

According to an embodiment, the processing unit is configured to output the switching signal for the switch-on time of the voltage waveform earlier if the number of periods with negative temporal offset exceeds the number of periods with positive temporal offset.

If the temporal offset is negative (i.e. the voltage follows the current and also the number of periods with a negative temporal offset is greater than the number of periods with a positive temporal offset within the total number of detected or observed and given periods), the voltage must be switched earlier if there are too many periods of negative offset. For this purpose, the frequency of the switching signal is increased.

According to another embodiment, the processing unit is configured to output the switching signal for the switch-on time of the voltage waveform later if the number of periods with negative temporal offset is less than the number of periods with positive temporal offset.

In addition or as an alternative to the previous embodiment, this embodiment represents that case, in which the voltage is switched later when the temporal offset is predominantly positive, i.e. that the current follows the voltage. In analogy to the above explanation, therefore, the frequency of the switching signal is lowered in this case.

According to another embodiment, the predeterminable number of periods of the frequency generator relates to a number of periods starting from a current point in time and looking back into the past, wherein the processing unit is furthermore configured to include a respective future or next period into the predeterminable number of periods when the future or next period is completed, and to remove the period furthest back in the past from the predeterminable number of periods.

In other words, this means that the processing unit updates the predetermined number of periods in accordance with the so-called sliding window mechanism (also: sliding window) and, after including a new value, removes the oldest value from the set of considered values (periods).

According to one embodiment, it is deposited for each individual period of the predeterminable number of periods if it has a positive or a negative temporal offset on the rising edges of the current waveform and the voltage waveform. In order to monitor the temporal variation of the resonant frequency, the oldest information, i.e. the temporal offset of the period furthest back in the past, is removed from the set of considered periods and the information about the time offset of the most recent period is added. This means that with each period, the ratio between negative and positive temporal offset may change at most by the value of two. This happens, for example, if starting from a ratio of 16 to 16 a period with a positive temporal offset is omitted or dropped and in addition a period with a negative temporal offset is added, resulting in a ratio of 17 to 15. This changed ratio results in an adaptation or adjustment of the switch-on time. Depending on how the temporal offset of the next period is, the ratio between positive and negative temporal offset balances out and the switch-on time can be maintained, or the switch-on time must be further changed if this ratio changes to 18 to 14.

Thus, the processing unit operates iteratively and determines the ratio between positive and negative temporal offset within the predetermined or predefinable number of periods anew with each period.

According to another embodiment, the processing unit is configured to determine, with each future period of the frequency generator, a difference between the number of periods with positive temporal offset and the number of periods with negative temporal offset, and to apply that difference to low pass filtering.

The processing unit may comprise a low-pass filter which smoothes out a change in the ratio of the number of periods with positive and negative temporal offset over time. This occurs in particular before the processing unit changes or adapts the switch-on time of the voltage waveform. Thus, the change of the switch-on time of the voltage waveform is mitigated and strong changes are avoided. The low-pass filter can be implemented, for example, as a unit or functional module of the processing unit.

According to another embodiment, the processing unit is configured to determine a second temporal offset between a falling edge of the current waveform and a falling edge of the voltage waveform for each period of the predeterminable number of periods, and further to determine whether the second temporal offset is positive or negative. The processing unit is furthermore configured to determine the number of periods with a positive second temporal offset and the number of periods with a negative second temporal offset within the predeterminable number of periods and to change a switch-off time of the voltage waveform if the number of periods with a positive second temporal offset differs from the number of periods with a negative second temporal offset.

In this embodiment, the processing unit is configured to provide the switching time for the falling edge. Thus, in addition to the rising edge, also the falling edge of the voltage waveform and the current waveform is monitored and controlled by the processing unit. This makes it possible to monitor and control a duty cycle of the frequency generator. In other words, a duty cycle or an operating cycle is provided by this.

It may be necessary to match the falling edges of the voltage waveform and the current waveform by turning off the voltage at the right time. If the switch-on time of the voltage is changed, this may cause the falling edges of the voltage and the current to deviate from each other in time. Thus, adjustments of the switch-on time of the voltage have at least indirectly influence on the temporal offset of the falling edges of current and voltage. To be able to eliminate the temporal offset of the falling edges and to allow a desired duty cycle of the frequency generator, the processing unit monitors the second temporal offset and is configured to change the switch-off time of the voltage waveform accordingly.

Basically, when changing the switch-off time, the same principles are applied as described above for changing the switch-on time.

According to a further embodiment, the processing unit is configured to output the switch-off time of the voltage waveform earlier if the number of periods with negative second temporal offset exceeds the number of periods with positive second temporal offset.

The signs of the temporal offset (negative or positive) with respect to the switch-off time are used identically as already done above with reference to the switch-on time. This means that with a negative second temporal offset of the falling edges, the voltage follows the current.

According to a further embodiment, the processing unit is configured to output the switch-off time of the voltage waveform later if the number of periods with negative second temporal offset is less than the number of periods with positive second temporal offset.

According to another embodiment, the processing unit is configured to determine, with each future period of the frequency generator, a difference between the number of periods with positive second temporal offset and the number of periods with negative second temporal offset, and to apply that difference to low pass filtering.

According to another embodiment the processing unit is configured to determine the switch-off time with respect to the switching signal of the switch-on time and to change the switch-off time with respect to the switching signal of the switch-on time depending on whether the number of periods with a positive second temporal offset differs from the number of periods with a negative second temporal offset.

The switching signal may, for example, be a sawtooth signal, from which the times for switching on and off are derived. For example, the time for switching on may be set to that time at which the sawtooth signal starts at zero. In addition, a value of the sawtooth signal may be defined, the reaching or exceeding of which predetermines the time for switching off the voltage signal or the voltage. Now, the value of the sawtooth signal, which specifies or predetermines the time for switching off the voltage signal or the voltage, can be changed in order to indirectly determine the time for switching off the voltage.

With this approach, only a single switching signal is used, wherein by this single switching signal both the switch-on time and the switch-off time are predetermined. In this case, the switch-on time can be determined directly by the switching signal, i.e., the switching signal controls or at least indirectly initiates the switching of a switch circuit. On the other hand, the switch-off time may be determined by or may refer to a value of the switching signal whilst the processing unit determines at what time (switch-off time) or at which point of the switching signal a signal for switching off the voltage must be output so that the second temporal offset is minimized or eliminated.

According to another aspect, an ion engine for a satellite is provided. The ion engine comprises a frequency generator for generating a frequency for an electric field and a control device as described above and below. In this case, the control device is coupled to the frequency generator to operate the frequency generator at a predetermined frequency, so that a fuel is ionized in the electric field.

According to one embodiment, the frequency generator comprises a resonant circuit and the resonant circuit is an RLC resonant circuit.

According to a further embodiment, the frequency generator comprises a semiconductor switch circuit which is coupled to the resonant circuit and is configured to control the resonant circuit according to the switching signal of the control device.

According to another aspect, a satellite, in particular a communication satellite, is provided. The satellite comprises an ion engine as described above and below, wherein the ion engine is configured and arranged to bring the satellite in an orbit or to keep it in orbit.

According to another aspect, a method for generating a switching signal for a frequency generator is provided. The method comprises the following steps: detecting a voltage waveform and a current waveform of a predeterminable number of periods of the frequency generator; determining a temporal offset between a rising edge of the current waveform and a rising edge of the voltage waveform for each period of the predeterminable number of periods; determining if this temporal offset is positive or negative; determining a difference between the number of periods with a positive temporal offset and the number of periods with a negative temporal offset within the predeterminable number of periods; generating and changing a switching signal for a switch-on time of the voltage waveform if the number of periods with a positive temporal offset differs from the number of periods with a negative temporal offset.

It should be noted that functions which are described with reference to the control device and/or the ion engine, can also be implemented analogously as method steps, even if these functions are not repeated at this point. It will be apparent, however, to one skilled in the art that the functions described with reference to the aforesaid devices may be part of this method.

In summary, the advantages and characteristics of the devices and method described herein can be described as follows:

It is desirable that the resonant circuit (usually an RLC resonant circuit) used in some ionic engines be operated in resonance to minimize losses. However, the ignition of the plasma may result in a change in the resonant frequency, so that a rapid tracking of the frequency and of the pulse width may be required to prevent the plasma from extinguishing or to allow ignition of the plasma at all. The control device described herein is based on the fact that a phase relation between current and voltage waveform is detected or acquired in order to conclude on a characteristic (inductive or capacitive behavior) of the resonant circuit. In the desired ideal case, the phase relation indicates neither an inductive nor capacitive behavior of the resonant circuit. However, if one of these two characteristics predominates, a switching behavior for the voltage waveform is adapted. The control device may, for example, be implemented in an FPGA (field programmable gate array) which comprises an output via which a value is sent or output to a direct digital synthesis (DDS) to generate a switching signal, for example in the form of a sawtooth signal. Both the frequency and the pulse width of the resonant circuit are controlled in accordance with the principles of the control device in a digital manner. Thus, both a better parameterization of the used controllers, for example PID controllers, as well as weight and volume reduction may be achieved by integration into a programmable hardware device, which is usually associated with significant cost savings in aerospace applications. In addition, by the simultaneous control of frequency and pulse width, increased efficiency of the entire ion engine may be achieved.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

In the following, exemplary embodiments are described in more detail with reference to the attached drawings. The drawings are schematic and not to scale. Same reference signs refer to same or similar elements. It is shown in.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
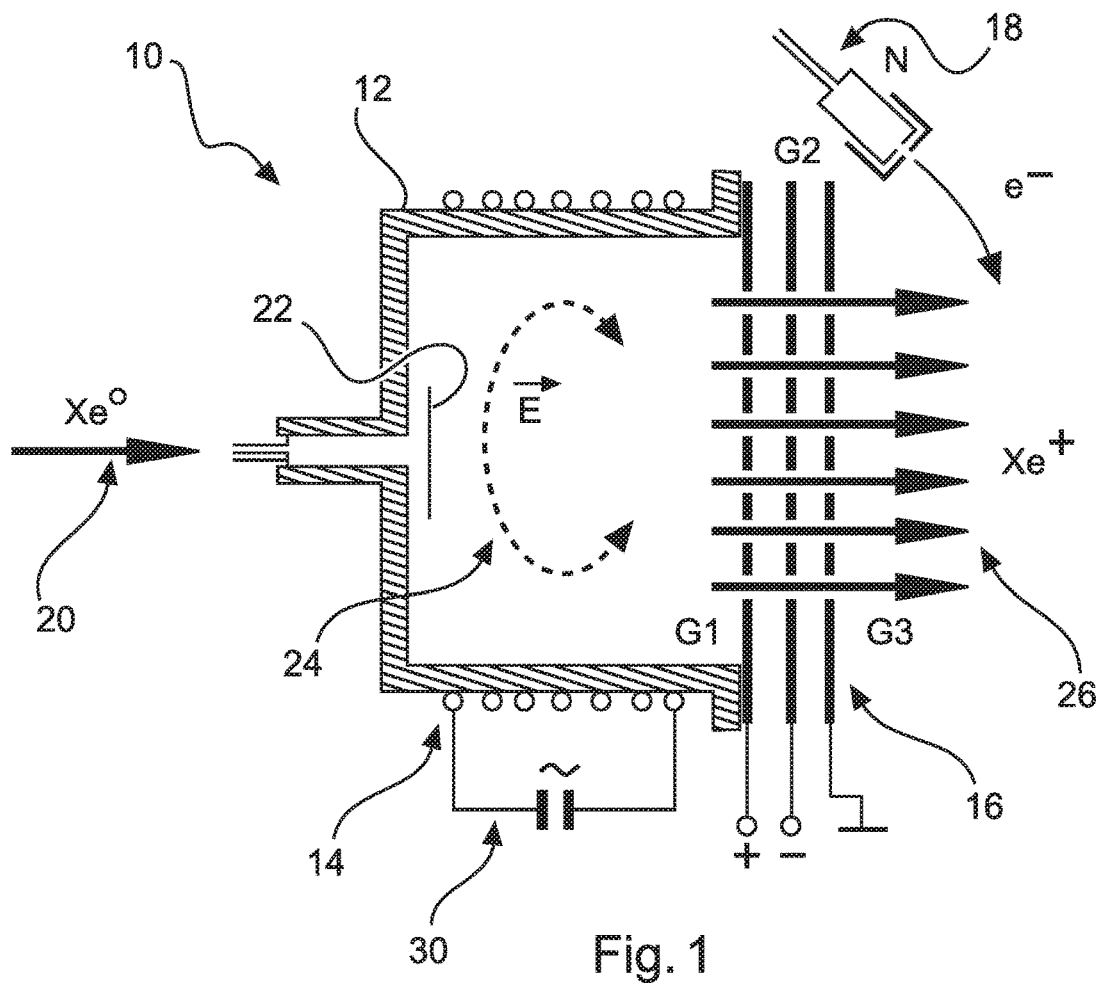
FIG. 1 is a schematic representation of an ion engine according to an exemplary embodiment.

FIG. 1 shows a schematic representation of an ion engine 10. The ion engine 10 comprises a housing 12 and a resonant circuit 30 with a coil 14. The coil 14 is arranged on the housing 12 such that an electric field 24 can be generated in the interior of the housing 12. A fuel 20, for example, an inert gas such as, for example, xenon, is supplied to the housing 12. In the interior of the housing 12, a cathode 22 is arranged to ionize the particles of the fuel 20 in cooperation with the electric field 24. A grating assembly 16 (grid assembly) with the grids G1, G2, G3 is arranged to accelerate the ionized particles of the fuel 20 and to convert the particles into an ion flow (or ion stream) 26, which causes a force according to the recoil principle. In order to neutralize the ion flow 26 emerging from the housing 12, a neutralizing unit 18 is provided.

The resonant circuit 30 is preferably operable at its resonant frequency to reduce the electrical losses and provide for efficient drive of the ion engine. The plasma has an influence on the inductance of the coil 14, so that its coupling changes. Thus, the coil 14 becomes a dynamic inductance, that is, its inductance value changes depending on the operation of the ion engine, which also changes the resonant frequency of the resonant circuit 30. For this reason, both the frequency and the pulse width of the resonant circuit 30 must be controlled.

Figure 2:
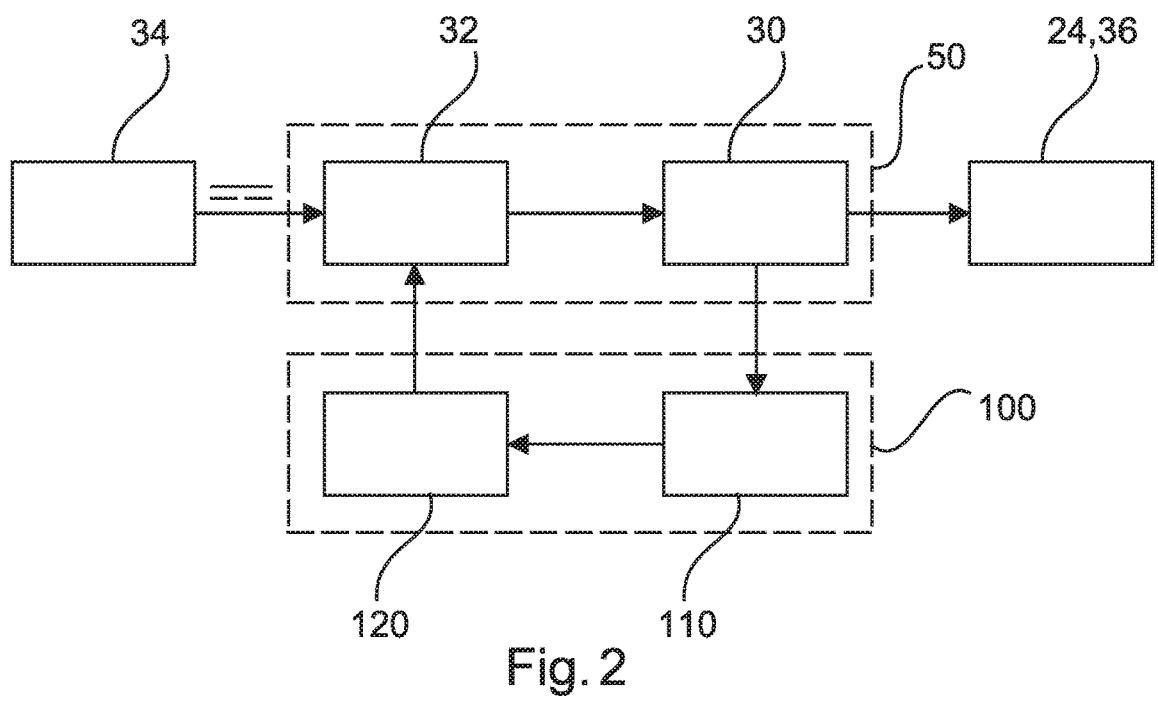
FIG. 2 is a schematic representation of the functional units of an ion engine according to a further exemplary embodiment.

FIG. 2 schematically shows the functional structure of an ion engine and its components, mainly the control unit of the electric field 24 and the load 36 with the plasma. A voltage supply 34 provides electrical energy for the operation of the frequency generator 50 and the control device 100. The frequency generator 50 comprises a switch circuit 32 and a resonant circuit 30. The switch circuit 32 is configured to switch a voltage value so that the resonant circuit 30 is supplied with voltage and operated at a predetermined frequency.

The frequency of the resonant circuit 30 is monitored and regulated or controlled by the control device 100. For this purpose, the control device 100 comprises an acquiring unit 110 and a processing unit 120. The acquiring unit 110 is configured to acquire the current waveform and the voltage waveform at the resonant circuit 30, as is described below with reference to FIG. 4. Based on the detected values of the acquiring unit 110, the processing unit 120 determines a phase relation of the current waveform and the voltage waveform in order to influence a switching behavior of the switch circuit 32, at least indirectly, based on this phase relation.

The resonant circuit 30 is arranged to generate an electric field 24 so that an ion flow is induced and maintained in the ion engine to provide propulsion energy for a spacecraft.

Figure 3:
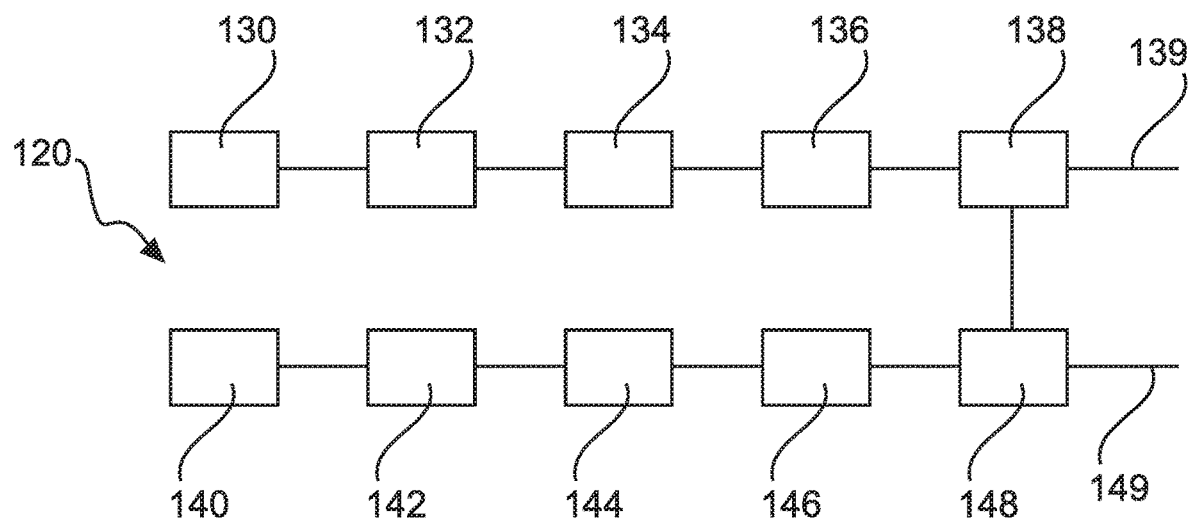
FIG. 3 is a schematic representation of a processing unit of a processing device according to another exemplary embodiment.

FIG. 3 shows an exemplary implementation of a processing unit 120, wherein the individual functions are shown in the illustration as separate modular units. In any case, it should be noted that the illustration of FIG. 3 does not represent a restriction or limitation regarding the implementation of the processing unit 120. The modular units shown may be implemented as shown, but several of these functions may be grouped together in one function block or one function may be distributed onto several function blocks.

First, it can be retrieved from FIG. 3 that there are two branches, namely the upper branch with the units 130, 132, 134, 136, 138 and the lower branch with the units 140, 142, 144, 146, 148. The units of the upper branch are provided for monitoring and controlling the rising edge of the current and voltage waveform, whereas the units of the lower branch are assigned to the falling edge.

The processing unit 120 comprises a flip-flop 130 to which both the voltage waveform and the current waveform are supplied, and which is designed to output a binary value (signal values 0 and 1) depending on whether the current waveform or the voltage waveform of the rising edge is detected or acquired first. The flip-flop 130 may, for example, be a so-called edge-triggered flip-flop. The flip-flop 130 thus determines for each rising edge (for each period) of the current and voltage waveform, which of these two signal waveforms arrives first at the flip-flop 130. Depending on this, either a 0 or a 1 is output to the counter 132.

The counter 132 is configured to hold or record for a predetermined number of periods how many times the current and how often the voltage was detected or acquired first. The counter 132 may also be implemented to have a single counter (count element) and either increment it (value of the counter plus 1) or decrement it (value of the counter minus 1). The counter may be incremented if the current is detected first, and decremented if the voltage is detected first. If the temporal offset between current waveform and voltage waveform is in equilibrium (in balance), i.e., both occur equally frequently, the value of the counter remains at 0 or there are two equal values for whether the current or the voltage was detected first. The value of the counter changes with each period of the resonant circuit since the value of the counter also undergoes a change with each period because the flip-flop 130 outputs either the value 1 or the value 0. The value of the counter may be output to the low-pass filter as a signed 11-bit binary number (11 bit signed), for example.

To smooth the rapid change of the counter value and to avoid an unstable behavior of the controller, a low pass 134 is provided. The low pass 134 also outputs a signed 11-bit binary number to the controller 136. A nominal value for the value of the counter element in the counter 132 may be preset to the controller 136. In particular, this nominal value may correspond to the equilibrium state between the voltage waveform and the current waveform, that is, which of these two signal waveforms was detected first in how many periods. The nominal value (setpoint) may as well represent the difference between the frequency of occurrence that the voltage was first detected and the frequency of occurrence that the current was first detected. In the latter case, the setpoint is then 0.

The controller 136 may output a 32-bit unsigned binary number to the switching signal generator 138 to adjust a switching signal generated by the switching signal generator. This occurs when the value of the counter 132 indicates a shifted phase relation between current and voltage waveform. The switching signal generator 138 may be a so-called direct digital synthesizer, DDS. The switching signal generator 138 generates and outputs a switching signal 139 for the rising edge of the voltage waveform.

The lower branch of the block diagram in FIG. 3 works in part analogous to the upper branch, wherein the lower branch is directed to the falling edge of the current waveform and the voltage waveform. The flip-flop 140, the counter 142, the low-pass 144 and the controller 146 work like the corresponding modules (flip-flop 130, counter 132, low-pass 134 and controller 136) of the upper branch. In this respect, reference is made to the above statements concerning the upper branch.

However, the lower branch differs from the upper branch with regard to the switching signal generator 148 for the falling edge. In this exemplary embodiment, the switching signal generator 148 is a comparator which compares the value received from the controller 146 with a signal value of the switching signal of the switching signal generator 138 and outputs the switching signal 149 for the falling edge in response to (depending on) this comparison. In other words, the switching signal 149 for the falling edge is also referenced to the switching signal 139, wherein the voltage for the falling edge is switched when the switching signal of the switching signal generator 138 reaches or exceeds the predetermined value.

Figure 4:
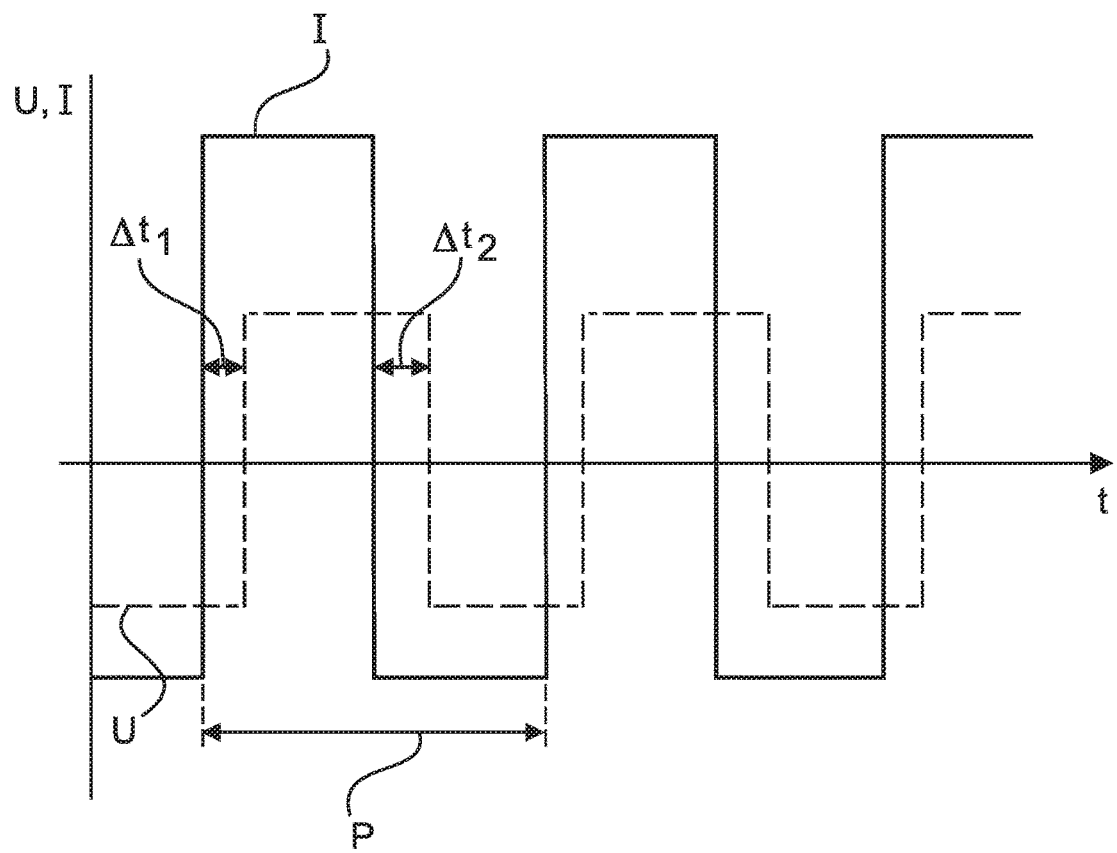
FIG. 4 is a schematic representation of a current and voltage waveform of a resonant circuit of an ion engine according to another exemplary embodiment.

FIG. 4 shows an exemplary current (I) and voltage waveform (U) with respect to time (t) and the phase relation between current and voltage. Current and voltage are each shown as rectangular signals, wherein the current waveform is shown by a solid line and the voltage waveform with a dashed line. A period p of the signal waveform is also shown and extends in time from rising edge to rising edge or from falling edge to falling edge.

A phase offset $\Delta t_1$ between the rising edges may be derived from the waveforms of current and voltage shown in FIG. 4. If this temporal phase offset is defined as the difference between the zero crossing of the voltage waveform and the zero crossing of the current waveform, the value of the temporal phase offset $\Delta t_1$ shown here is a positive value. It is of course conceivable that this temporal phase offset $\Delta t_1$ may also be negative and that its absolute value (the duration) may vary depending on the characteristics of the resonant circuit.

In addition to the temporal offset of the rising edges, depending on the pulse width (duty cycle) of current and voltage, the second temporal offset $\Delta t_2$ occurs between the falling edges. For the second temporal offset, the same basic statements apply as already presented with reference to the first temporal offset $\Delta t_1$ so that reference is made thereto.

In the case of resonance and also with correctly set pulse width, there is no significant phase offset between the current waveform and the voltage waveform either at the rising edge or at the falling edge. A capacitive behavior of the resonant circuit has the effect that the current is ahead of the voltage, so that the frequency must be increased. On the other hand, an inductive behavior of the resonant circuit has the effect that the voltage is ahead of the current, so that the frequency must be reduced.

Additionally, it is noted that "comprising" or "including" does not exclude any other elements or steps and "a" or "an" does not exclude a multitude or plurality. It is further noted that features or steps which are described with reference to one of the above exemplary embodiments may also be used in combination with other features or steps of other exemplary embodiments described above. Reference signs in the claims are not to be construed as a limitation.

LIST OF REFERENCE NUMBERS 10 ion engine
12 housing
14 coil 16 grid assembly
18 neutralizing unit
20 fuel, inert gas
22 cathode
24 electric field
26 accelerated ions
30 resonant circuit
32 switch circuit
34 voltage supply
36 load, plasma
50 frequency generator
100 control device
110 acquiring unit
120 processing unit
130 flip-flop
132 counter
134 low-pass
136 controller
138 switching signal generator for rising edge
139 switching signal for rising edge
140 flip-flop
142 counter
144 low-pass
146 controller
148 switching signal generator for falling edge
149 switching signal for falling edge While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A control device for a frequency generator, comprising:
an acquiring unit; and
a processing unit;
wherein the acquiring unit is configured to acquire a voltage course and a current course of a determinable number of periods of the frequency generator and to transmit these to the processing unit;
wherein the processing unit is configured to determine a temporal offset $\Delta t_1$ between a rising edge of the current course and a rising edge of the voltage course for each period of the determinable number of periods, and further to determine if this temporal offset $\Delta t_1$ is positive or negative;
wherein the processing unit is configured to determine a difference between the number of periods with positive temporal offset and the number of periods with negative temporal offset within the determinable number of periods;
wherein the processing unit is configured to generate and adapt a switching signal for a switch-on time of the voltage course if the number of periods with positive temporal offset differs from the number of periods with negative temporal offset.

2. The control device of claim 1, wherein the processing unit is configured to output the switching signal for the switch-on time of the voltage waveform earlier if the number of periods with negative temporal offset exceeds the number of periods with positive temporal offset.

3. The control device of claim 1, wherein the processing unit is configured to output the switching signal for the switch-on time of the voltage waveform later if the number of periods with negative temporal offset is less than the number of periods with positive temporal offset.

4. The control device of claim 1,
wherein the predeterminable number of periods of the frequency generator relates to a number of periods starting from a current point in time and looking back into the past; and
wherein the processing unit is furthermore configured to include a respective future or next period into the predeterminable number of periods and to remove the period furthest back in the past from the predeterminable number of periods.

5. The control device of claim 4, wherein the processing unit is configured to determine, with each future period of the frequency generator, a difference between the number of periods with positive temporal offset and the number of periods with negative temporal offset, and to apply that difference to low pass filtering.

6. The control device of claim 1,
wherein the processing unit is configured to determine a second temporal offset $\Delta t_2$ between a falling edge of the current waveform and a falling edge of the voltage waveform for each period of the predeterminable number of periods, and further to determine whether the second temporal offset is positive or negative;
wherein the processing unit is configured to determine the number of periods with positive second temporal offset and the number of periods with negative second temporal offset within the determinable number of periods;
wherein the processing unit is configured to adapt a switch-off time of the voltage waveform if the number of periods with positive second temporal offset differs from the number of periods with negative second temporal offset.

7. The control device of claim 6, wherein the processing unit is configured to output the switch-off time of the voltage waveform earlier if the number of periods with negative second temporal offset exceeds the number of periods with positive second temporal offset.

8. The control device of claim 6, wherein the processing unit is configured to output the switch-off time of the voltage waveform later if the number of periods with negative second temporal offset is less than the number of periods with positive second temporal offset.

9. The control device of claim 6, wherein the processing unit is configured to determine, with each future period of the frequency generator, a difference between the number of periods with positive second temporal offset and the number of periods with negative second temporal offset, and to apply that difference to low pass filtering.

10. The control device of claim 6, wherein the processing unit is configured to determine the switch-off time with respect to the switching signal of the switch-on time and to change the switch-off time with respect to the switching signal of the switch-on time depending on whether the number of periods with a positive second temporal offset differs from the number of periods with a negative second temporal offset.

11. An ion engine for a satellite, comprising:
a frequency generator for generating a frequency for an electric field; and
a control device for the frequency generator, comprising:

an acquiring unit; and a processing unit;

wherein the acquiring unit is configured to acquire a voltage course and a current course of a determinable number of periods of the frequency generator and to transmit these to the processing unit;

wherein the processing unit is configured to determine a temporal offset $\Delta t_1$ between a rising edge of the current course and a rising edge of the voltage course for each period of the determinable number of periods, and further to determine if this temporal offset $\Delta t_1$ is positive or negative;

wherein the processing unit is configured to determine a difference between the number of periods with positive temporal offset and the number of periods with negative temporal offset within the determinable number of periods;

wherein the processing unit is configured to generate and adapt a switching signal for a switch-on time of the voltage course if the number of periods with positive temporal offset differs from the number of periods with negative temporal offset; and wherein the control device is coupled to the frequency generator to operate the frequency generator at a predetermined frequency, so that a fuel is ionized in the electric field.

12. The ion engine of claim 11, wherein the frequency generator comprises a resonant circuit; and wherein the resonant circuit is an RLC resonant circuit.

13. The ion engine of claim 12, wherein the frequency generator comprises a semiconductor switch circuit which is coupled to the resonant circuit and is configured to control the resonant circuit in accordance with the switching signal of the control device.

14. A satellite comprising an ion engine, wherein the ion engine comprises:

a frequency generator for generating a frequency for an electric field; and a control device for the frequency generator, comprising:

an acquiring unit; and a processing unit;

wherein the acquiring unit is configured to acquire a voltage course and a current course of a determinable number of periods of the frequency generator and to transmit these to the processing unit;

wherein the processing unit is configured to determine a temporal offset $\Delta t_1$ between a rising edge of the current course and a rising edge of the voltage course for each period of the determinable number of periods, and further to determine if this temporal offset $\Delta t_1$ is positive or negative;

wherein the processing unit is configured to determine a difference between the number of periods with positive temporal offset and the number of periods with negative temporal offset within the determinable number of periods;

wherein the processing unit is configured to generate and adapt a switching signal for a switch-on time of the voltage course if the number of periods with positive temporal offset differs from the number of periods with negative temporal offset;

wherein the control device is coupled to the frequency generator to operate the frequency generator at a predetermined frequency, so that a fuel is ionized in the electric field; and wherein the ion engine is configured and arranged to bring the satellite in an orbit or to keep it in orbit.

15. The satellite of claim 14, wherein the satellite is a communication satellite.

* * * * *